United States Patent
Gui et al.

(10) Patent No.: US 10,054,658 B2
(45) Date of Patent: Aug. 21, 2018

(54) METHOD AND APPARATUS FOR USING B1 MAP TO CORRECT INTENSITY OF MAGNETIC RESONANCE IMAGES

(71) Applicant: GENERAL ELECTRIC COMPANY, Schenectady, NY (US)

(72) Inventors: Dawei Gui, Sussex, WI (US); Xiaoli Zhao, New Berlin, WI (US); Zhenghui Zhang, Waukesha, WI (US); Hao Shen, Sussex, WI (US); Stephen Joseph Garnier, Waukesha, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 736 days.

(21) Appl. No.: 14/584,272

(22) Filed: Dec. 29, 2014

(65) Prior Publication Data

US 2016/0187438 A1    Jun. 30, 2016

(51) Int. Cl.
*G01R 33/56*     (2006.01)
*G01R 33/565*    (2006.01)
*G01R 33/24*     (2006.01)

(52) U.S. Cl.
CPC ....... *G01R 33/5659* (2013.01); *G01R 33/246* (2013.01)

(58) Field of Classification Search
CPC .... G01R 33/246; G01R 33/443; G01R 33/50; G01R 33/5633; G01R 33/5659; A61B 5/055; A61B 5/0042; A61B 5/7207; G06T 11/003; H01J 11/10
See application file for complete search history.

(56) References Cited

U.S. PATENT DOCUMENTS

| | | |
|---|---|---|
| 7,372,270 B2 | 5/2008 | Sung et al. |
| 8,077,955 B2 | 12/2011 | Dannels et al. |
| 8,217,652 B2 | 6/2012 | Dannels |
| 8,558,547 B2 | 10/2013 | Sacolick et al. |
| 8,594,400 B2 | 11/2013 | Darrow et al. |
| 2003/0060698 A1 | 3/2003 | Mistretta |
| 2006/0224062 A1 | 10/2006 | Aggarwal et al. |
| 2010/0239142 A1 | 9/2010 | Dannels et al. |
| 2012/0032676 A1 | 2/2012 | Dannels |

(Continued)

OTHER PUBLICATIONS

International Search Report and Written Opinion for International Application No. PCT/US2015/066407, dated Apr. 6, 2016. 12 pages.

*Primary Examiner* — Clayton E Laballe
*Assistant Examiner* — Ruifeng Pu
(74) *Attorney, Agent, or Firm* — Grogan, Tuccillo & Vanderleeden, LLP

(57) ABSTRACT

A controller that is operatively connected with a magnet assembly, which defines a target volume; and an image processor, which is configured to obtain calibration data from the controller; map B1 transmit intensity from the magnet assembly to the target volume, based on the calibration data; calculate a B1 transmit shading correction based at least on the map of B1 transmit intensity and on pulse sequence parameters; obtain k-space data of an imaging subject within the target volume from the controller operating the magnet assembly based on the pulse sequence parameters; develop an MR image from the k-space data; and apply the B1 transmit shading correction to the MR image.

15 Claims, 9 Drawing Sheets

(56) References Cited

U.S. PATENT DOCUMENTS

| | | |
|---|---|---|
| 2012/0032677 A1 | 2/2012 | Dannels |
| 2013/0134972 A1 | 5/2013 | Schulte et al. |
| 2015/0073258 A1* | 3/2015 | Mazer .................... G01R 33/50 600/410 |
| 2015/0355298 A1* | 12/2015 | Ben-Eliezer ........... A61B 5/055 324/309 |
| 2016/0003928 A1* | 1/2016 | Chen .................. G01R 33/5611 324/309 |

* cited by examiner $$B(X,Y) = M_0(X,Y) * \text{SIN}(B_{1+} * \theta_0) * \frac{1-E1}{1-E1*\text{COS}(B_{1+}*\theta_0)} * B_{1b-}$$

FIG. 4

$$S(X,Y) = M_0(X,Y) * \text{SIN}(B_{1+} * \theta_0) * \frac{1-E1}{1-E1*\text{COS}(B_{1+}*\theta_0)} * B_{1s-}$$

FIG. 5

$$P(X,Y) = M_{spgr}(X,Y) * B_{1s-} * \text{SIN}(B_{1+}*\alpha) * \frac{1-E1}{1-E1*\text{COS}(B_{1+}*\alpha)}$$

FIG. 6

$$P(X,Y) = M_{se}(X,Y) * B_{1s-} * \frac{1-E1}{1-E1*\text{COS}(B_{1+}*\alpha)*\text{COS}(B_{1+}*\pi)} * \text{SIN}(B_{1+}*\alpha) * \text{SIN}2(B_{1+}*\pi/2)$$

FIG. 7

$$P(X,Y) = M_{psd}(X,Y) * B_{1s-} * EPG(B_{1+}, \text{PULSE SEQUENCE ACQUISITION PROPERTIES, T1, T2, SLICE PROFILES, ETC.})$$

FIG. 8

$$Q(X,Y) = \frac{P(X,Y)}{B_{1s\text{-}} * SIN(B_{1+} * \alpha) * SIN^2(B_{1+} * \pi/2)} * \frac{1 - E1 * COS(B_{1+} * \alpha) * COS(B_{1+} * \pi)}{1 + E1 * COS\alpha}$$

FIG. 11

$$Q(X,Y) = \frac{P(X,Y)}{B_{1s\text{-}} * SIN(B_{1+} * \alpha)} * \frac{1 - E1 * COS(B_{1+} * \alpha)}{1 + E1 * COS\alpha}$$

FIG. 12

METHOD AND APPARATUS FOR USING B1 MAP TO CORRECT INTENSITY OF MAGNETIC RESONANCE IMAGES

BACKGROUND

Technical Field

Embodiments of the invention relate generally to magnetic resonance imaging. Particular embodiments relate to enhancing images obtained from magnetic resonance equipment.

Discussion of Art

Magnetic resonance images are typically produced by algorithms that presume perfect homogeneity of a constant magnetic field B0 that used to align spins of atoms within a target volume. Homogeneity of a radio frequency magnetic field B1, the field used to perturb the spins of selected atoms within the target volume, is also presumed. These algorithms rely on presumptions that, however, do not perfectly match the physics of a real magnetic resonance apparatus. In particular, these algorithms have tended to ignore, for example, inhomogeneities of intensity of the B1 magnetic field as transmitted from an RF coil.

As will be appreciated, it is generally desirable to account for variables (e.g., imperfections) that might cause imaging equipment to deviate from the presumptions underlying the algorithms used to produce images. In view of the above, it is desirable to provide apparatus and methods for correcting the intensity of MR images, using a map of B1 transmit intensity (also referred to hereafter as transmit sensitivity). Such a map can be acquired or estimated from scan data and/or system design information.

BRIEF DESCRIPTION

Embodiments of the invention implement a method that includes mapping a B1 transmit intensity (transmit sensitivity) from an RF coil to a target volume; calculating a B1 transmit shading correction based at least on the mapped B1 transmit intensity and on pulse sequence parameters; and applying the B1 transmit shading correction to an MR image acquired within the target volume using a pulse sequence defined by the pulse sequence parameters.

Certain embodiments provide a controller that is operatively connected with a magnet assembly, which defines a target volume; and an image processor, which is configured to obtain calibration data from the controller; map B1 transmit intensity from the magnet assembly to the target volume, based on the calibration data; calculate a B1 transmit shading correction based at least on the map of B1 transmit intensity and on pulse sequence parameters; obtain k-space data of an imaging subject within the target volume from the controller operating the magnet assembly based on the pulse sequence parameters; develop an MR image from the k-space data; and apply the B1 transmit shading correction to the MR image.

Other embodiments provide an image processor that is configured to calculate a B1 transmit shading correction based on pulse sequence parameters and based on calibration data obtained from a controller operatively connected to the magnet assembly; develop an MR image from k-space data produced by the controller operating the magnet assembly based on the pulse sequence parameters; and apply the B1 transmit shading correction to the MR image.

DRAWINGS

The present invention will be better understood from reading the following description of non-limiting embodiments, with reference to the attached drawings, wherein below:

FIGS. 4-5 show signaling models for calibration scans according to the present invention.

FIGS. 6-8 show signaling models for various imaging scans according to the present invention.

FIGS. 11-12 show correction models for use in the methods of FIG. 9 or FIG. 10.

DETAILED DESCRIPTION

Figure 1:
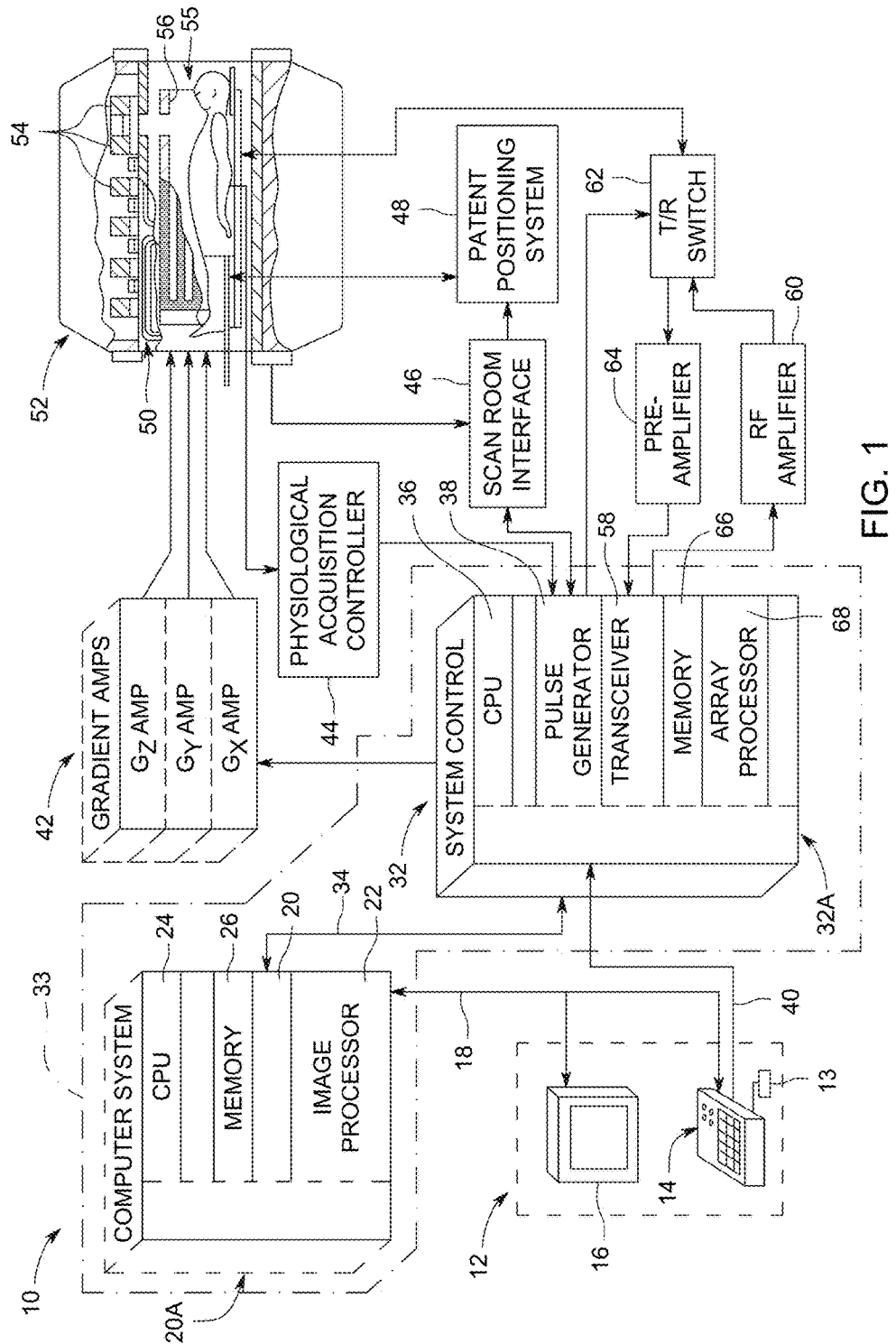
FIG. 1 shows schematically an exemplary magnetic resonance imaging (MRI) system that incorporates embodiments of the present invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the term "spin" refers to a fundamental property of subatomic particles such as protons, electrons, and neutrons. Individual unpaired subatomic particles each possess $+/-\frac{1}{2}$ spin. The term "B0" refers to a constant magnetic field applied to an imaging subject in order to align the spins of atoms within the subject. The term "B1" refers to a radio-frequency magnetic field applied transverse to B0 in order to perturb the spins of atoms within the subject.

FIG. 1 shows major components of an exemplary magnetic resonance imaging (MRI) system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a. The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 33.

The MRI system control 32 includes a set of modules connected together by a backplane 32a. These include a CPU module 36 as well as a pulse generator module 38. The CPU module 36 connects to the operator console 12 through a data link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 33, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0 throughout a target volume 55 that is enclosed by the magnet assembly 52) and a whole-body RF coil 56 (which, in operation, provides a transverse magnetic field B1 that is generally perpendicular to B0 throughout the target volume 55). In an embodiment of the invention, RF coil 56 is a multi-channel coil. A transceiver module 58 in the MRI system control 32 produces pulses that are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit mode or receive mode.

After the multi-channel RF coil 56 picks up the RF signals produced from excitation of the target, the transceiver module 58 digitizes these signals. The MRI controller 33 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the data link 34 to the computer system 20 where it is stored in memory. In response to commands received from the operator console 12, this image data may be archived in long-term storage or it may be further processed by the image processor 22 and conveyed to the operator console 12 and presented on the display 16.

Figure 2:
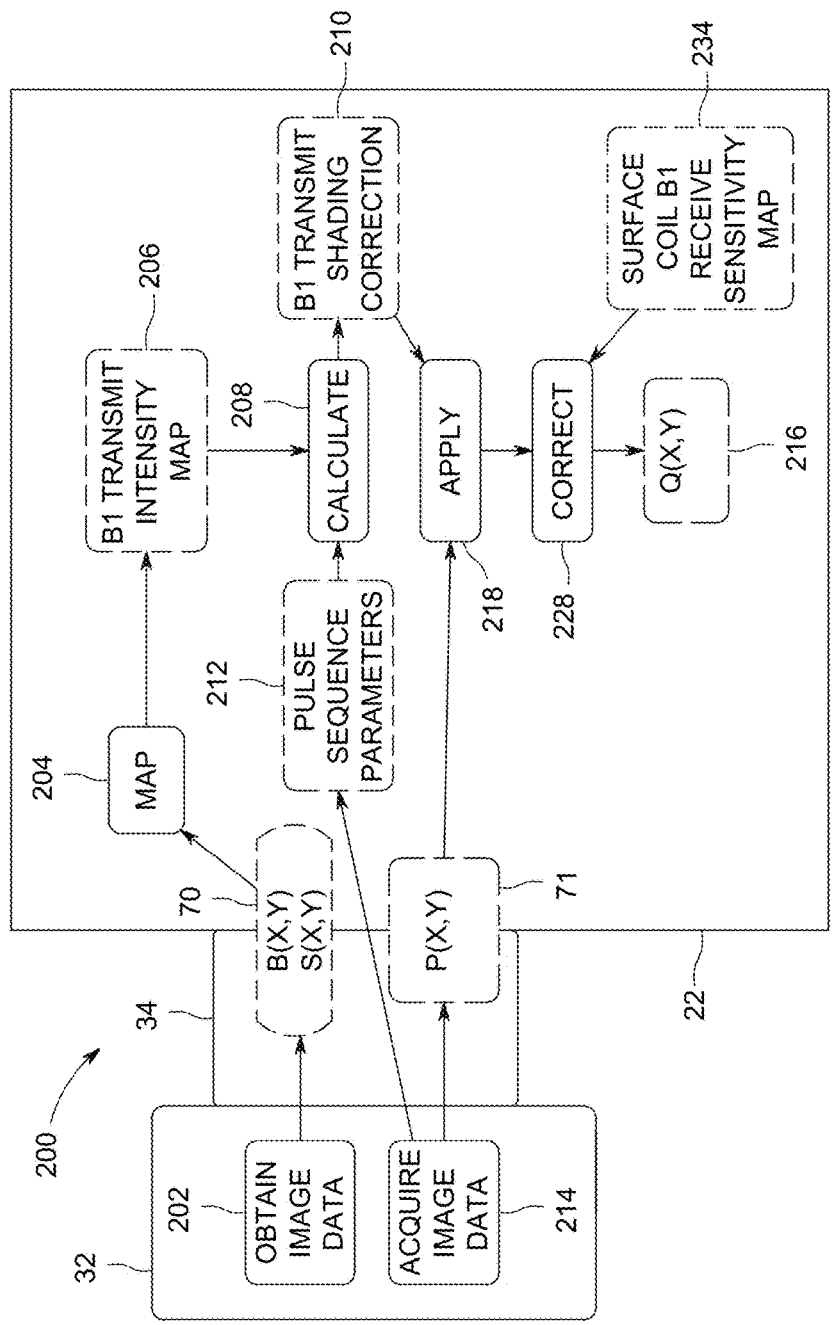
FIG. 2 shows schematically a method for using an acquired B1 map to correct intensity of an MR image according to the present invention.

According to embodiments of the invention, as shown in FIG. 2, the computer system 20 implements a method 200 that includes the image processor 22 repeatedly obtaining image data from the MRI system control 32 through the data link 34. In particular, with the target volume 55 empty, the image processor 22 instructs the MRI system control 32 to obtain 202 calibration data 70 for mapping 204 a map 206 of B1 transmit intensity (transmit sensitivity) from the RF coil 56 into the target volume 55. The image processor 22 then calculates 208 a B1 transmit shading correction 210, based at least on the B1 transmit intensity map 206 and on pulse sequence parameters 212 (using pulse sequence modeling, e.g. by expanded phase graphing or Bloch-Siegert equations). At a later time, the image processor 22 may request the MRI system control 32 to acquire 214 k-space data 71 for an imaging subject, using a pulse sequence defined by the pulse sequence parameters 212. The image processor 22 then applies 218 the B1 transmit shading correction 210 to the k-space data 71, or to a preliminary image (not shown) that is based on the k-space data 71, in order to produce an MR image 216. Further, the image processor 22 corrects 228 the MR image 216 according to a map of surface coil receive sensitivity 234. Thus, embodiments of the invention implement a uniformity correction that accounts for both a) non-uniformity caused by the transmit B1 inhomogeneity; and b) non-uniformity caused by the surface coil receive B1 inhomogeneity.

The B1 transmit intensity map 206 can be mapped 204 in many different ways. For example, the Bloch-Siegert Shift method can be utilized to encode the B1 inhomogeneity with signal phase changes. Alternatively, an RF pulse train (mostly with a gradient echo type) can be utilized to encode B1 inhomogeneity with signal amplitude changes, per the DREAM sequence devised by Nehrke and Börnert. Another option is to use a calibration scan with Maxwell equation to estimate transmit B1 inhomogeneity. Yet another alternative is to use transmit volume coil design parameters and subject information to estimate the transmit B1 inhomogeneity. Alternatively, a receive calibration scan protocol can be used, assuming that the volume transmit B1 inhomogeneity is similar to the volume receive B1 inhomogeneity in order to estimate the volume transmit B1 inhomogeneity.

To correct for surface receive B1 non-uniformity, surface coil B1 receive sensitivity can be estimated from surface receive calibration data S(x,y). Two methods are presented.

As a first option, volume receive calibration data B(x,y) and transmit B1 (B1b+) map 206 can be utilized to estimate a subject proton density map M0x,y, then the estimated subject proton density map M0(x,y) can be used with the transmit B1 (B1b+) map 206 to estimate the surface receive B1 map (B1s−) 234. A second option is to directly estimate the surface receive B1 map (B1s−) 234 from the surface receive calibration data S(x,y), using the transmit B1 map (B1+) 206 with an image processing filtering technique.

Figure 3:
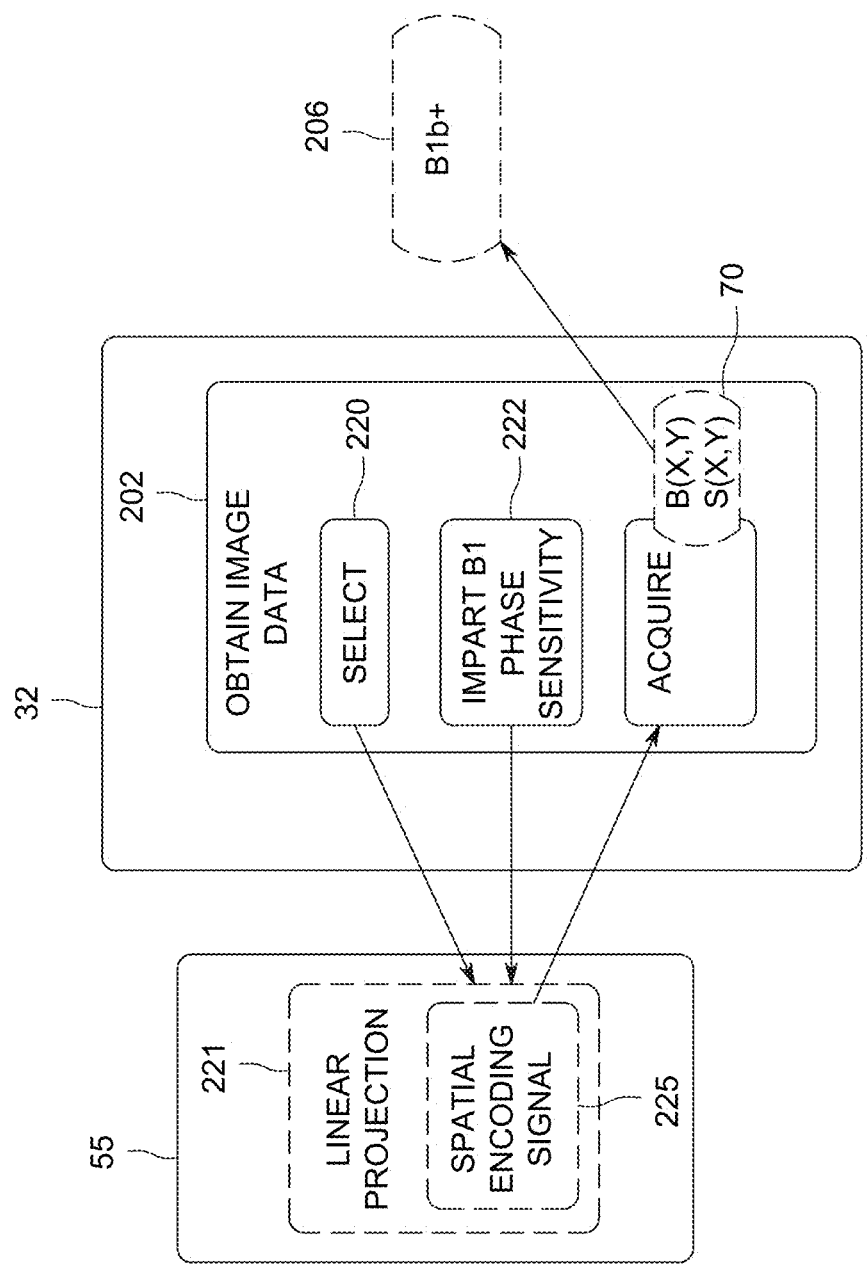
FIG. 3 shows schematically steps for acquiring a B1 map according to the present invention.

In certain embodiments, as shown in FIG. 3, the MRI system control 32 may obtain 202 the calibration data 70 (also described herein as B(x,y) and S(x,y)), for mapping 204 the B1 transmit intensity map 206, by first selecting 220 a linear projection 221 within the target volume 55, then imparting 222 B1 phase sensitivity to the linear projection, and then acquiring 224 a spatial encoding signal 225 from the linear projection. Indeed, the MRI system control 32 may repeat this process to acquire 224 a plurality of spatial encoding signals 225 from a plurality of linear projections 221, and may interpolate 226 among the plurality of spatial encoding signals 225 in order to obtain a map 206 that fills the target volume.

Advantageously, in certain implementations of the method 200 the image processor 22 may also correct 228 the MR image 216 based at least on a surface coil B1 receive sensitivity map 234, for example according to a PURE algorithm or similar known method.

The B1 transmit shading correction 210 may be calculated 208 based on an extended phase graph (EPG) algorithm, or based on the Bloch equations, using signaling models as shown in FIGS. 4-5, in which B(x,y): Calibration image pixel intensities using body receive coil; S(x,y): Calibration image pixel intensities using surface coil receive; $M_0(x,y)$: subject proton density; C(x,y): Surface coil sensitivity map; $B_1+$: The volume coil transmit B1 inhomogeneity at location (x,y); $B_{1b}-$: The subject proton density as estimated from volume coil receive B1 inhomogeneity at location (x,y); E1: Pulse sequence related term, which can be pre-calculated for any given pulse sequence and is equal to $e^{-TR/T1}$; P(x,y): MR image pixel intensities obtained from an arbitrary scan of a target volume; $M_{spgr}$: MR image pixel intensities as would be obtained using spoiled gradient pulse sequence, if transmit intensity and receive sensitivity were homogeneous; $M_{sse}$: MR image pixel intensities as would be obtained using spin echo pulse sequence, if transmit intensity and receive sensitivity were homogeneous; $M_{dse}$: MR image pixel intensities as would be obtained using DWI pulse sequence with dual spin echo if T1 and T2 relaxation were ignored.

FIGS. 6-8 show imaging models describing for various scan pulse sequences. For example, for a spoiled gradient echo sequence, an MR image P(x,y)—where P(x,y) represents the uncorrected pixel intensities—could be obtained as shown in FIG. 6. For a spin echo or DWI with single spin echo sequence and ignoring the T1 and T2 relaxations during data acquisition, an MR image P(x,y) could be obtained as shown in FIG. 7. For a DWI pulse sequence with dual spin echo, or for fast spin echo sequences, EPG algorithm or Bloch equation could be applied to obtain an MR image P(x,y) as shown in FIG. 8. In this context, EPG: "Extended Phase Diagram" function or algorithm, which takes a inputs the listed properties of the MR scan sequence being used.

Figure 9:
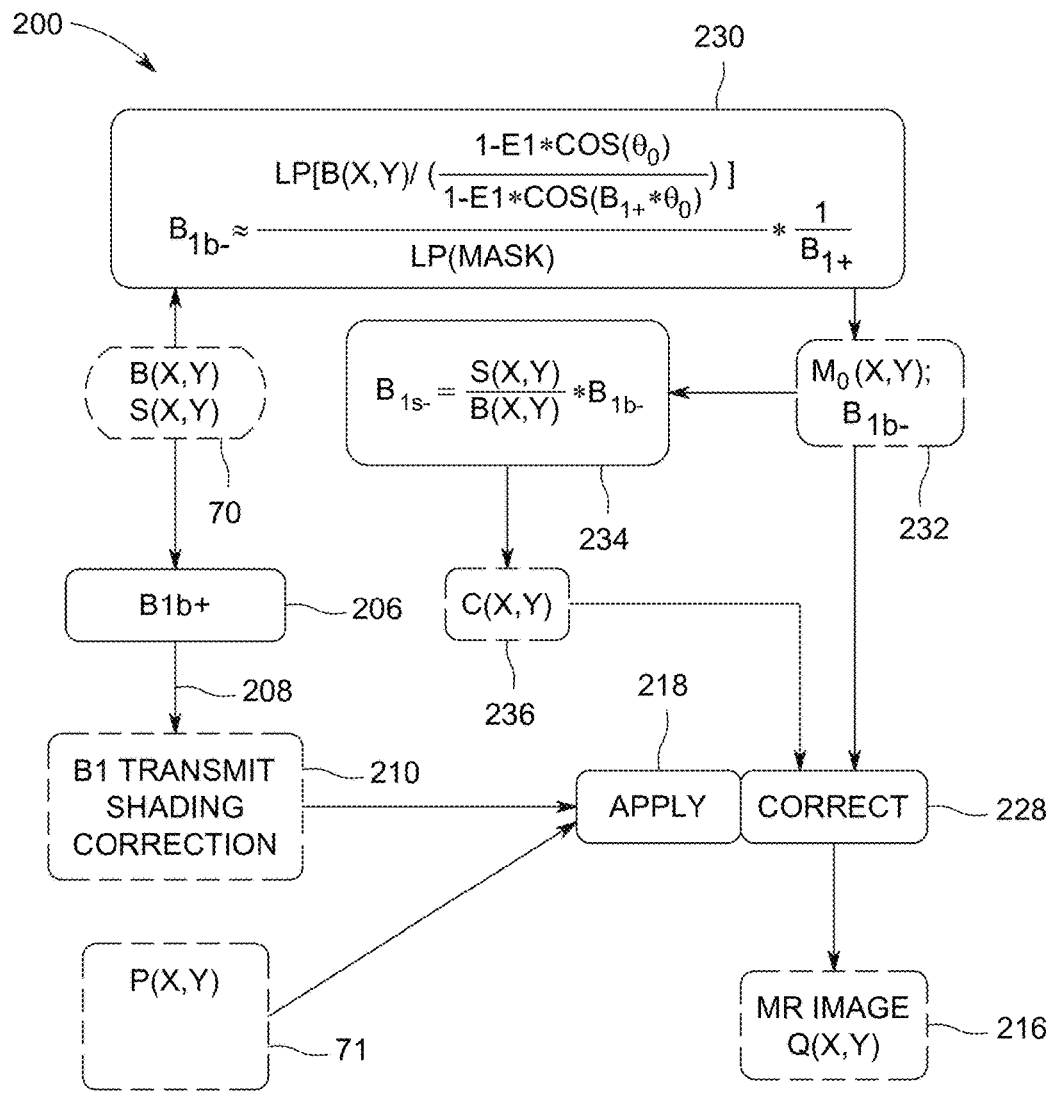
FIG. 9 shows schematically a first method for correcting intensity of an MR image using a B1 transmit intensity map as well as a B1 receive sensitivity map, according to the present invention.

Thus, according to the method 200, as shown in FIG. 9, first estimate 230 a volume coil B1 receive sensitivity map ($B_{1b}-$) and further estimate 232 a subject proton density $M_0(x,y)$ based on calibration data 70; then estimate 234 a surface coil B1 sensitivity map $B_{1s}-$ from the calibration data (B(x,y) and S(x,y)) 70, based on the volume coil receive B1 map $B_{1b}-$; develop 236 a receive correction C(x,y) that is based on the surface coil B1 receive sensitivity map B1s−; acquire or estimate the B1 transmit intensity map 206 from the calibration data 70; calculate 208 the transmit correction 210 from the B1 transmit intensity map 206; then apply 218 the transmit correction 210 to the imaging subject k-space data 71 while developing an MR image 216, and further correct 228 the MR image 216 by the receive correction C(x,y).

Figure 10:
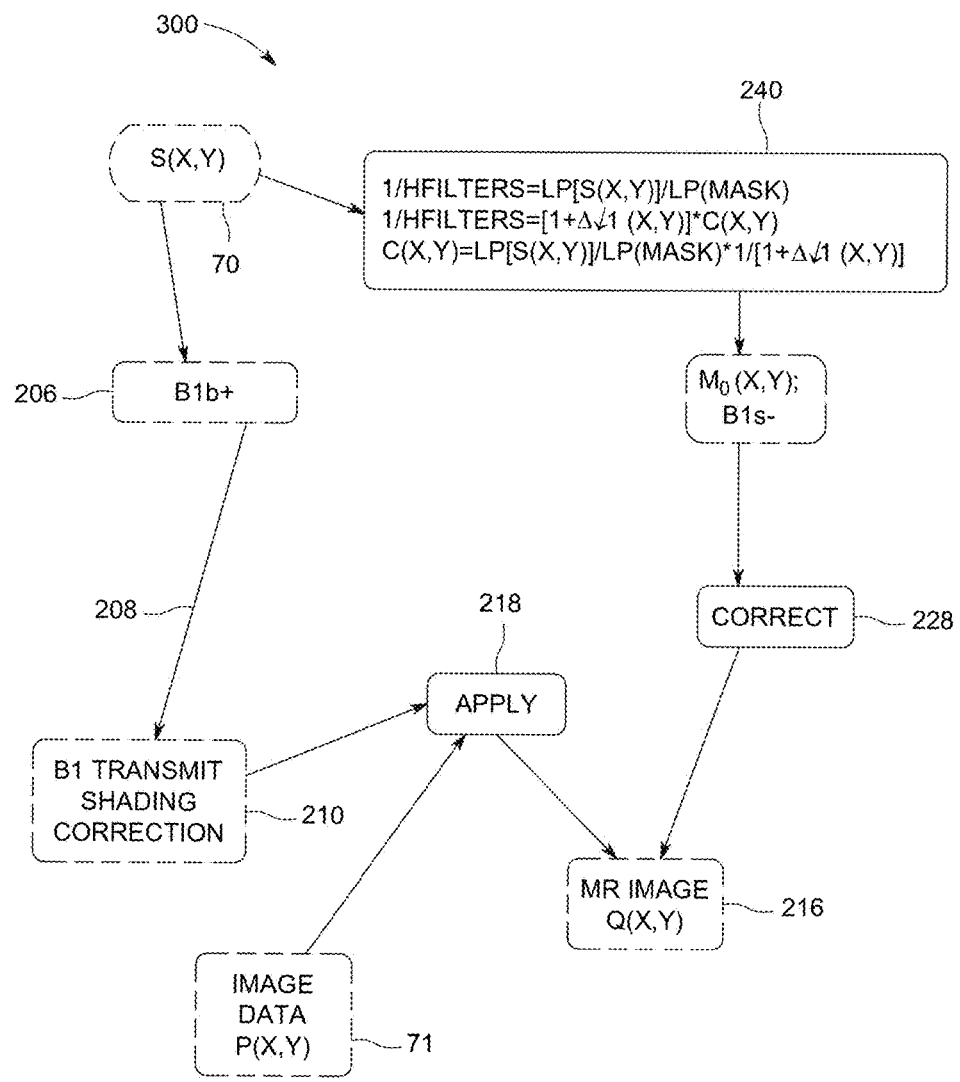
FIG. 10 shows schematically a second method for using an acquired B1 map to correct intensity of an MR image according to the present invention.
Figure 13:
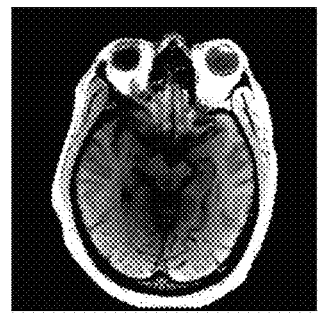
FIGS. 13-22 show comparative MR images obtained with or without the use of the present invention.
Figure 14:
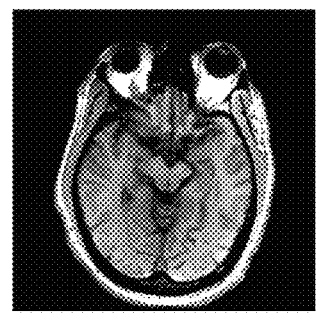
Figure 15:
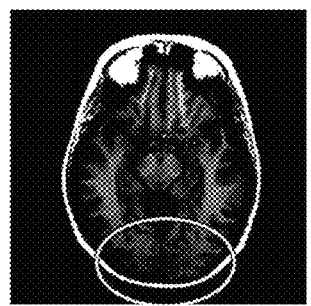
Figure 16:
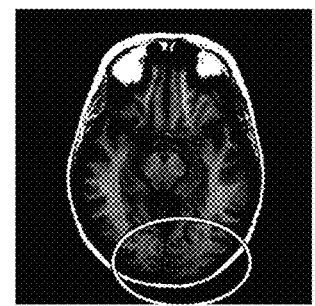
Figure 17:
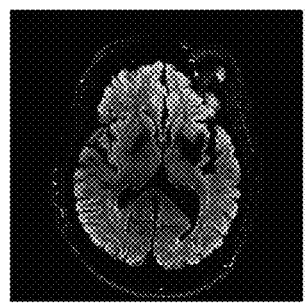
Figure 18:
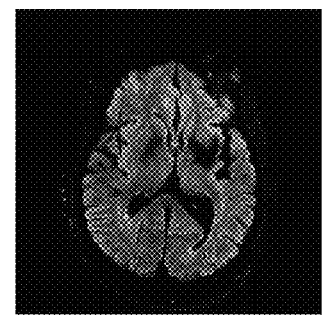
Figure 19:
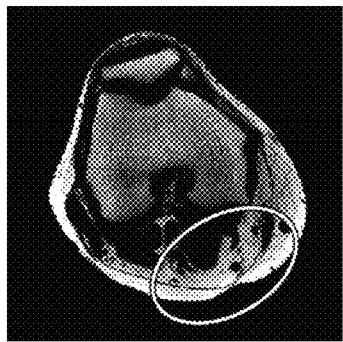
Figure 20:
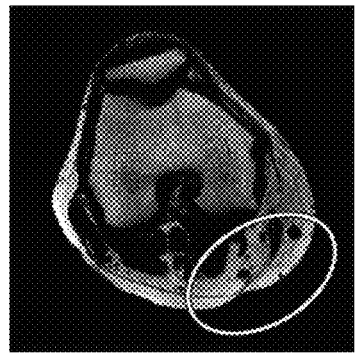
Figure 21:
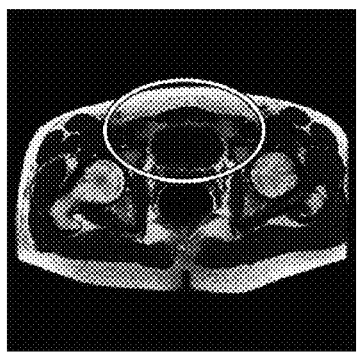
Figure 22:
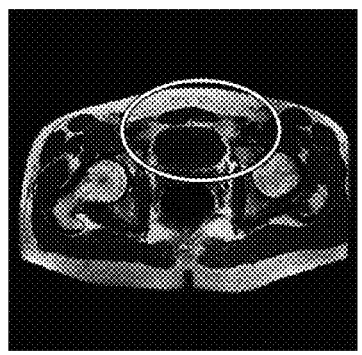

According to another exemplary method 300, as shown in FIG. 10, first estimate 240 the surface coil B1 receive sensitivity B1s− and the subject proton density $M_0(x,y)$ from calibration data 70; then calculate 208 the transmit correction 210 from the B1 transmit intensity map (B1b+) 206 and from pulse sequence parameters; then apply 218 the transmit correction 210 to the imaging subject k-space data 71 while obtaining the MR image 216; and then correct 228 the MR image 216 based on the surface coil receive sensitivity B1s−.

FIGS. 11-12 show correction models that can be used at steps 218, 228 of the methods 200 or 300. For example, for a spin echo or DWI with single spin echo sequence and ignoring the T1 and T2 relaxations during data acquisition, a corrected MR image Q(x.y) could be obtained as shown in FIG. 11. For a spoiled gradient echo sequence, a corrected MR image Q(x.y)—where Q(x,y) represents the corrected pixel intensities—could be obtained as shown in FIG. 12.

Generally, according to aspects of the invention, EPG numerical simulation is suitable for correcting MR images produced by, e.g., 2DFSE, SSFSE, 3DFSE/CUBE pulse sequences. The Bloch equation analytic solution is suitable for correcting MR images produced by, e.g., GRE, spin echo, DWI, FIESTA pulse sequences. Underlying assumptions of some implementations include ignoring inhomogeneity of B0, assuming a slice profile, and ignoring slice cross-talk or magnetization transfer.

As a result, embodiments of the invention produce MR images with enhanced clarity and uniformity of contrast compared to prior art images. Among FIGS. 13-22, the odd numbered images are those produced by conventional means, whereas the even numbered images are those produced by an embodiment of the invention, of the same imaging subject.

Thus, embodiments of the invention implement a method that includes mapping a B1 transmit intensity from an RF coil to a target volume; calculating a B1 transmit shading correction based at least on the mapped B1 transmit intensity and on pulse sequence parameters; and applying the B1 transmit shading correction to an MR image acquired within the target volume using a pulse sequence defined by the pulse sequence parameters. For example, mapping the B1 transmit intensity may include selecting a linear projection within the target volume, imparting B1 phase sensitivity to the linear projection, and acquiring a spatial encoding signal from the linear projection. Also, mapping the B1 transmit intensity may include selecting a plurality of linear projections, imparting B1 phase sensitivity to the plurality of linear projections, acquiring a plurality of spatial encoding signals from the plurality of linear projections, and interpolating among the plurality of spatial encoding signals to obtain a map that fills the target volume. The method may also include correcting the MR image for receive coil sensitivity. Correcting the MR image for receive coil sensitivity may include estimating subject proton density from volume coil calibration data, then estimating surface coil sensitivity from surface calibration data, subject proton density, and volume transmit B1 sensitivity. Alternatively, correcting the MR image for receive coil sensitivity may include estimating subject proton density from surface coil calibration data, then estimating surface coil sensitivity from surface coil calibration data, subject proton density, and volume transmit B1 sensitivity. The B1 transmit shading correction may be applied using extended phase graph algorithm, or Bloch equation. The B1 transmit shading correction may be applied accounting for material properties of an imaging subject within the target volume.

Certain embodiments of the invention provide an controller that is operatively connected with a magnet assembly, which defines a target volume; and an image processor, which is configured to obtain calibration data from the controller; map B1 transmit intensity from the magnet assembly to the target volume, based on the calibration data; calculate a B1 transmit shading correction based at least on the map of B1 transmit intensity and on pulse sequence parameters; obtain k-space data of an imaging subject within the target volume from the controller operating the magnet assembly based on the pulse sequence parameters; develop an MR image from the k-space data; and apply the B1 transmit shading correction to the MR image. Mapping the B1 transmit intensity may include selecting a linear projection within the target volume, imparting B1 phase sensitivity to the linear projection, and acquiring a spatial encoding signal from the linear projection. Mapping the B1 transmit intensity also may include selecting a plurality of linear projections, imparting B1 phase sensitivity to the plurality of linear projections, acquiring a plurality of spatial encoding signals from the plurality of linear projections, and interpolating among the plurality of spatial encoding signals to fill the target volume. The image processor may be further configured to correct the MR image for receive coil sensitivity. Correcting the MR image for receive coil sensitivity may include estimating subject proton density from volume coil calibration data, then estimating surface coil sensitivity from surface calibration data, subject proton density, and volume transmit B1 sensitivity. Alternatively, correcting the MR image for receive coil sensitivity may include estimating subject proton density from surface coil calibration data, then estimating surface coil sensitivity from surface coil calibration data, subject proton density, and volume transmit B1 sensitivity. The B1 transmit shading correction may be applied using extended phase graph algorithm, or using Bloch equation. The B1 transmit shading correction may be applied accounting for material properties of an imaging subject within the target volume.

Other embodiments provide an apparatus that includes an image processor configured to calculate a B1 transmit shading correction based on pulse sequence parameters and based on calibration data obtained from a controller operatively connected to the magnet assembly; develop an MR image from k-space data produced by the controller operating the magnet assembly based on the pulse sequence parameters; and apply the B1 transmit shading correction to the MR image. The image processor also may be further configured to apply a receive coil sensitivity correction to the MR image.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:
1. A method comprising:
mapping a B1 transmit intensity from an RF coil to a target volume;
calculating a B1 transmit shading correction based at least on the mapped B1 transmit intensity and on pulse sequence parameters;
applying the B1 transmit shading correction to an MR image acquired within the target volume using a pulse sequence defined by the pulse sequence parameters;
correcting the MR image for receive coil sensitivity; and
wherein correcting the MR image for receive coil sensitivity includes estimating subject proton density from volume coil calibration data, then estimating surface coil sensitivity from surface calibration data, subject proton density, and volume transmit B1 sensitivity.

2. The method of claim 1 wherein mapping the B1 transmit intensity includes selecting a linear projection within the target volume, imparting B1 phase sensitivity to the linear projection, and acquiring a spatial encoding signal from the linear projection.

3. The method of claim 2 wherein mapping the B1 transmit intensity includes selecting a plurality of linear projections, imparting B1 phase sensitivity to the plurality of linear projections, acquiring a plurality of spatial encoding signals from the plurality of linear projections, and interpolating among the plurality of spatial encoding signals to obtain a map that fills the target volume.

4. The method of claim 1 wherein correcting the MR image for receive coil sensitivity includes estimating subject proton density from surface coil calibration data, then estimating surface coil sensitivity from surface coil calibration data, subject proton density, and volume transmit B1 sensitivity.

5. The method of claim 1 wherein the B1 transmit shading correction is applied using extended phase graph algorithm.

6. The method of claim 1 wherein the B1 transmit shading correction is applied using Bloch equation.

7. The method of claim 1 wherein the B1 transmit shading correction is applied accounting for material properties of an imaging subject within the target volume.

8. An apparatus comprising:
a controller that is operatively connected with a magnet assembly, which defines a target volume; and
an image processor that is configured to:
obtain calibration data from the controller;
map B1 transmit intensity from the magnet assembly to the target volume, based on the calibration data;
calculate a B1 transmit shading correction based at least on the map of B1 transmit intensity and on pulse sequence parameters;
obtain k-space data of an imaging subject within the target volume from the controller operating the magnet assembly based on the pulse sequence parameters;
develop an MR image from the k-space data;
apply the B1 transmit shading correction to the MR image;
correct the MR image for receive coil sensitivity; and
wherein correcting the MR image for receive coil sensitivity includes estimating subject proton density from volume coil calibration data, then estimating surface coil sensitivity from surface calibration data, subject proton density, and volume transmit B1 sensitivity.

9. The apparatus of claim 8 wherein mapping the B1 transmit intensity includes selecting a linear projection within the target volume, imparting B1 phase sensitivity to the linear projection, and acquiring a spatial encoding signal from the linear projection.

10. The apparatus of claim 9 wherein mapping the B1 transmit intensity includes selecting a plurality of linear projections, imparting B1 phase sensitivity to the plurality of linear projections, acquiring a plurality of spatial encoding signals from the plurality of linear projections, and interpolating among the plurality of spatial encoding signals to fill the target volume.

11. The apparatus of claim 8 wherein correcting the MR image for receive coil sensitivity includes estimating subject proton density from surface coil calibration data, then estimating surface coil sensitivity from surface coil calibration data and volume transmit B1 sensitivity.

12. The apparatus of claim 8 wherein the B1 transmit shading correction is applied using extended phase graph algorithm.

13. The apparatus of claim 8 wherein the B1 transmit shading correction is applied using Bloch equation.

14. The apparatus of claim 8 wherein the B1 transmit shading correction is applied accounting for material properties of an imaging subject within the target volume.

15. An apparatus comprising:
an image processor that is configured to:
calculate a B1 transmit shading correction based on pulse sequence parameters and based on calibration data obtained from a controller operatively connected to the magnet assembly;
develop an MR image from k-space data produced by the controller operating the magnet assembly based on the pulse sequence parameters;
apply the B1 transmit shading correction to the MR image;
apply a receive coil sensitivity correction to the MR image; and
wherein the receive coil sensitivity correction is based at least in part on estimating subject proton density from volume coil calibration data, then estimating surface coil sensitivity from at least one of surface calibration data, subject proton density, and volume transmit B1 sensitivity.

* * * * *